United States Patent [19]
Tripathi et al.

[11] Patent Number: 6,109,775
[45] Date of Patent: *Aug. 29, 2000

[54] METHOD FOR ADJUSTING THE DENSITY OF LINES AND CONTACT OPENINGS ACROSS A SUBSTRATE REGION FOR IMPROVING THE CHEMICAL-MECHANICAL POLISHING OF A THIN-FILM LATER DISPOSED THEREON

[75] Inventors: Prabhakar P. Tripathi, Santa Clara; Keith Chao, San Jose; Ratan K. Choudhury, Milpitas; Gauri C. Das; Nicholas K. Eib, both of San Jose; Ashok K. Kapoor, Palo Alto; Thomas G. Mallon, Santa Clara, all of Calif.

[73] Assignee: LSI Logic Corporation, Milpitas, Calif.

[*] Notice: This patent is subject to a terminal disclaimer.

[21] Appl. No.: 08/925,021

[22] Filed: Sep. 8, 1997

Related U.S. Application Data

[63] Continuation of application No. 08/573,192, Dec. 15, 1995, abandoned, and a continuation-in-part of application No. 08/362,839, Dec. 22, 1994, Pat. No. 5,477,466, and a continuation of application No. 07/732,843, Jul. 19, 1991, Pat. No. 5,379,233.

[51] Int. Cl.[7] .............................. G06F 17/00; G06F 17/50
[52] U.S. Cl. ........................ 364/488; 364/489; 364/490; 364/491
[58] Field of Search .................................... 364/488, 489, 364/490, 491; 438/180, 8, 183; 430/5; 395/500

[56] References Cited

U.S. PATENT DOCUMENTS

| | | | |
|---|---|---|---|
| 4,520,269 | 5/1985 | Jones | 250/492.2 |
| 4,654,269 | 3/1987 | Leher | 428/428 |
| 4,707,770 | 11/1987 | Pasch et al. | 156/662.1 |
| 4,717,644 | 1/1988 | Jones et al. | 430/296 |
| 4,761,560 | 8/1988 | Glendinning | 250/492.2 |
| 4,812,962 | 3/1989 | Witt | 364/490 |
| 4,879,257 | 11/1989 | Patrick | 437/195 |
| 5,023,205 | 6/1991 | Reche | 437/228 |
| 5,242,770 | 9/1993 | Chen et al. | 430/5 |
| 5,379,233 | 1/1995 | Tripathi et al. | 364/491 |
| 5,387,550 | 2/1995 | Cheffings et al. | 437/189 |
| 5,494,853 | 2/1996 | Lur | 437/195 |
| 5,532,516 | 7/1996 | Pasch et al. | 257/752 |

*Primary Examiner*—Kevin J. Teska
*Assistant Examiner*—Vuthe Siek

[57] ABSTRACT

Disclosed is the formation of additional lines, either dummy lines or active lines, in an electrically conductive pattern of lines to provide more uniform loading for either etching or chemical/mechanical polishing of a layer of electrically conductive material from which the pattern of lines is formed. Also disclosed is the use of additional or dummy vias to balance the loading during etching of the vias, as well as to provide stress relief for underlying metal in regions or areas having a low density of vias. Further disclosed is the use of a working grid on the integrated circuit structure to analyze the spacing of lines or vias for the above effects.

18 Claims, 9 Drawing Sheets

```
┌─────────────────────────────────────────┐
│   FORMING A GRID OVER AN IMAGE OF AN    │
│      INTEGRATED CIRCUIT STRUCTURE       │
└─────────────────────────────────────────┘
                    │
┌─────────────────────────────────────────┐
│  EVALUATING THE GRID TO ANALYZE OPTICAL │
│  PROXIMITY EFFECTS WHICH MAY BE CAUSED  │
│   BY THE PROXIMITY OF INTEGRATED CIRCUIT│
│    STRUCTURE LINES WITHIN THE GRID      │
└─────────────────────────────────────────┘
                    │
┌─────────────────────────────────────────┐
│   EVALUATING THE GRID TO ANALYZE NON-   │
│    OPTICAL PROXIMITY EFFECTS SUCH AS    │
│   ETCHANT DEPLETION WHICH MAY BE CAUSED │
│  BY THE RELATIVE DISTRIBUTION OF METAL IN│
│  THE INTEGRATED CIRCUIT STRUCTURE WITHIN│
│                 THE GRID                │
└─────────────────────────────────────────┘
                    │
┌─────────────────────────────────────────┐
│    MODIFYING THE GRID AND INTEGRATED    │
│   CIRCUIT STRUCTURE IMAGES TO CORRECT   │
│    FOR BOTH OPTICAL AND NON-OPTICAL     │
│           PROXIMITY EFFECTS             │
└─────────────────────────────────────────┘
```

FIG. 9

METHOD FOR ADJUSTING THE DENSITY OF LINES AND CONTACT OPENINGS ACROSS A SUBSTRATE REGION FOR IMPROVING THE CHEMICAL-MECHANICAL POLISHING OF A THIN-FILM LATER DISPOSED THEREON

CROSS-REFERENCE TO RELATED APPLICATIONS

This application is a continuation of U.S. application Ser. No. 08/573,192, filed Dec. 15, 1995, now abandoned and a continuation-in-part of U.S. patent application Ser. No. 08/362,839, now U.S. Pat. No. 5,477,466, filed Dec. 22, 1994, and a continuation of U.S. patent application Ser. No. 07/732,843, filed Jul. 19, 1991, and now issued as U.S. Pat. No. 5,379,233 on Jan. 3, 1995.

BACKGROUND OF THE INVENTION

1. Field of the Invention

This invention relates to improvements in the pattern design used in the processing of integrated circuit structures on semiconductor wafers to form lines and contact openings and/or vias. More particularly, the invention comprises a process for adjusting the distribution or density of lines and contact openings and/or vias in a layer comprising a portion of an integrated circuit structure to make the distribution more uniform throughout the layer.

2. Description of the Related Art

In the formation of integrated circuit structures, active devices, such as transistors and diodes, are formed in and on a semiconductor wafer, such as a single crystal silicon wafer. Passive devices such as resistive and capacitive structures may also be formed at this level. These devices must be electrically connected together to form the desired electrical circuitry. Such electrical connection or "wiring" is conventionally referred to as "metallization" in the integrated circuit field, although at least some of the wiring may be done using electrically conductive materials other than metals such as ,for example, doped polysilicon, metal silicides, metal nitrides, etc. Such "metallization" includes the formation of contact openings (filled with electrically conductive material) extending through one or more first insulation layers down to the underlying electrodes of the devices (e.g., the source, drain, and gate electrodes of an MOS transistor). It also includes a patterned electrically conductive layer (formed by the masking and selective etching of a layer of electrically conductive material such as a metal layer) over such insulation layers which makes electrical contact with the underlying filled contact openings, or filled vias from such a first patterned layer through further insulation layers, and subsequent patterned layers of electrically conductive material in electrical contact with such filled vias, to thereby provide vertical electrical connections between such patterned layers of electrically conductive material.

After the initial contact openings are formed through one or more insulation layers down to the active devices, and (at least in some instances) after the filling of such contact openings with electrically conductive materials such as, for example, one or more metals, doped polysilicon, metal silicides, metal nitride, etc., a thin layer of electrically conductive material, typically a metal, is deposited over the structure by sputtering, CVD techniques, or vacuum evaporation over the entire wafer. The unwanted portions of this layer are then removed by patterning, i.e., photomasking and etch procedures, leaving the surface of the insulation layer or layers covered with thin lines of conductor. Typically one or more intermediate insulation layers are formed over this first patterned layer of electrically conductive material, and at least one subsequent patterned metal layer is then formed over such an intermediate insulation layer of layers, with metal-filled openings or vias then formed through such intermediate insulation layer or layers to provide electrical interconnection vertical between the respective patterned layer of electrically conductive material.

Thus, in the formation of lines, and contact openings and/or vias, on an integrated circuit structure both the photomasking and etching procedures which constitute the overall patterning of the lines, contact openings, and vias are important. Patterning errors can cause warped or misaligned patterns that ultimately can result in undesirable electrical characteristics. Hence, the patterning process is critical to ensuring a satisfactory product. Alignment and exposure continue to be at the heart of the photomasking portion of patterning.

During the photomasking process, an optical phenomena, diffraction, occurs which causes printing to vary from one section of the circuit to another. Diffraction is due to the bending of a wave of energy as it passes the opaque edge of a mask. Improvement of aligners has been achieved by using shorter wavelengths which lessen the diffraction effect. However, undesirable resolution and registration still occur even with shorter wavelengths.

For example, if a circuit is core limited, i.e., having lots of gates connected with metal lines, then the printing of lines in the circuit remains homogeneous. However, if the circuit has one section which is heavily populated with lines and another section which is less heavily populated with lines (hereinafter called lonely lines), then the width of the lines and the roughness of the edges of the lines vary from one section to another because of this diffraction phenomenon. As circuits become smaller, the undesirability of varying line size dramatically increases. For example, the difference in line size in one (1.0) micron technology is probably about 0.05 microns which is approximately a 5 percent difference in size. But at one-half micron (0.5) technology, the approximate size of the effect is still the same, but the difference is now approximating 10 percent, which is unacceptable.

Optical alignment and resolution can also be affected by a lack of planarity of the photoresist layer onto which the mask image is being optically projected by radiation. Various planarization techniques have been proposed, including chemical/mechanical polishing (CMP) procedures. However, such procedures, which involve the simultaneous chemical etching and mechanical abrading of several materials (e.g., metals, oxides, and organic resist materials, etc.), a non-homogeneous density of lines on an integrated circuit structure can affect the ability of such CMP procedures to produce the desired planarization of the structure.

Etching in semiconductor processing may also entail inherent limitations due to a circuit's physical layout. An ideal anisotropic etch leaves vertical walls in the resist and metal layers. However, because the etching chemical dissolves the top of the wall for a longer time than the bottom, the resulting hole is wider at the top than at the bottom. Hence the etch is isotropic. This etch undesirably undercuts the metal layer beneath the resist which may result in resist lifting or narrow lines. Dry etching processes, such as reactive ion etching, have decreased undercutting, but have not completely solved this problem.

Dry etch techniques rely in part on material from the masking layer (usually photoresist) to achieve anisotropic profiles. This has the undesirable side effect of making the etch anisotropically sensitive to masking pattern density. Hence, lonely lines in an isolated pattern will etch more isotropic than a heavily populated pattern (since less photoresist is present in areas having lonely lines). Both patterns may exist on the same chip design.

Another problem to be addressed, effectively the mirror image of the problem above, is the issue of microloading where the etching rate of the material is dependent upon the amount of material to be etched. Hence, more surface to be exposed (more materials to be removed) will take a longer period of time to etch. It logically follows that a part of a chip having different and more densely populated area lines (and therefore less material to be etched away) will take a shorter time to etch than an area of less density populated lines.

Similar problems can occur in the etching of vias and/or contact openings through insulation layers when the density of the vias and/or contact openings is not uniform across the semiconductor wafer.

Parent U.S. patent application Ser. Nos. 07/732,843 and 08/362,839, the disclosures of which are hereby incorporated by reference, address the problem of irregular line spacing or density by providing for the addition of lines referred to as "dummy lines" in areas where "lonely lines" are located.

Another factor to consider during patterning is electromigration. Typically, in circuit layout design, lines are designed to be at one predetermined width, irrespective of their future use. This layout design may create electromigration problems, especially in lines which must carry a heavy load. Long, very thin metal lines, typically formed of aluminum, carrying high currents are particularly prone to electromigration. The high current sets up an electric field in the lead and generates heat. As current and frequency increase, the electromigration resistance goes down. During the electromigration, the aluminum in the lead becomes mobile and begins to diffuse to either end of the lead. Under extreme conditions, the lead itself is severed. In the past, a worst case current density was assumed and all metal lines were made wide enough to carry that current. This is undesirable as line widths become smaller and more functions are put on a single chip.

Another phenomena occurring during patterning is inherent stress due to layering. Because various layers of material are printed on the circuit, all of which may have different coefficients of expansion/contraction and degrees of hardness, an intrinsic stress builds up between these layers. This stress may result in the linear expansion of the softer materials, i.e., generally metals, causing metal voiding even with no voltage. Therefore, stress due to layering may also produce an electrical disconnection. Such stress can also result in the expansion of the underlying metal layer, such as aluminum, into the vias in an insulation layer over the aluminum layer. When the density of the vias over such a stressed aluminum layer is not homogeneous, the amount of expansion into the less densely spaced vias can be more pronounced, sometime resulting in a volcano-like vertical expansion of the aluminum into and through such vias.

Therefore, there is need for improving the patterning design used in the processing of integrated circuit structures.

SUMMARY OF THE INVENTION

In one aspect, the invention comprises the formation of additional lines, either dummy lines or active lines, in an electrically conductive pattern of lines to provide more uniform loading for either etching or chemical/mechanical polishing of the layer of electrically conductive material from which the pattern of lines is formed.

In another aspect, the invention comprises the use of additional or dummy vias to balance the loading during etching of the vias, as well as to provide stress relief for underlying metal in regions or areas having a low density of vias.

The invention further includes the use of a working grid on the integrated circuit structure to analyze the spacing of lines or vias for the above effects.

BRIEF DESCRIPTION OF THE DRAWINGS

FIG. 9 is a flowsheet illustrating the process of using a grid image superimposed on an image of an integrated circuit structure to analyze for both optical and non-optical proximity effects.

DETAILED DESCRIPTION OF THE INVENTION

The invention comprises modification of the pattern design of electrically conductive lines, and/or the pattern design of vias and/or contact openings for various reasons, including improving the uniformity of the loading for chemical/mechanical polishing of a pattern of electrically conductive material, to balance the loading during etching of such lines, vias, and/or contact openings, and to provide stress relief for underlying metal in regions or areas having a low density of vias. A working grid can be used on the integrated circuit structure to analyze the spacing of lines or vias for optical proximity effects and non-optical proximity effects.

a. Use of Dummy Lines to Balance Loading During Patterning

In accordance with one aspect of the present invention, dummy lines are printed on the circuit to insure standard sizing of all working lines. The number and positioning of dummy lines is determined by the spacing between lonely lines in both the horizontal and vertical directions. In other words, if the spacing exceeds a predetermined threshold distance in both the horizontal and vertical directions, then dummy lines are inserted. In one embodiment of the present invention, specifically addressing lithographic effects the threshold distances in the horizontal and vertical directions is typically approximately less than $2\mu$. This threshold value will vary when considering the undercutting problems separately. For example, as the percentage of photoresist on the surface area of the chip increases to greater than $100\mu$. Clearly, the threshold distance in the horizontal and vertical directions may differ.

To ensure the desired uniformity in loading for purposes of patterning to form both the working lines and the dummy lines, both types of lines are formed of the same material by simultaneous patterning of a single layer of electrically conductive material to form both the working lines and the dummy lines. While the wiring harness of working lines (and dummy lines) will typically be formed by patterning an aluminum layer, it should be noted that it is within the scope of the invention to use other metals, as well as non-metallic electrically conductive materials, for the electrically conductive layer to be patterned to form the working lines and the dummy lines. Examples of such other metals and electrically conductive non-metallic materials include gold, tungsten, titanium, tantalum, niobium; metal alloys such as a titanium/tungsten alloy; doped polysilicon; and electrically conductive compounds such as metal silicides and metal nitrides, e.g., tungsten silicide, titanium silicide, titanium nitride, etc. It will, therefore, be understood that use of terms such as "metal" and "metallization" herein are intended to be by way of illustration, and not of limitation with respect to other electrically conductive materials which may be used instead of "metal".

Figure 1:
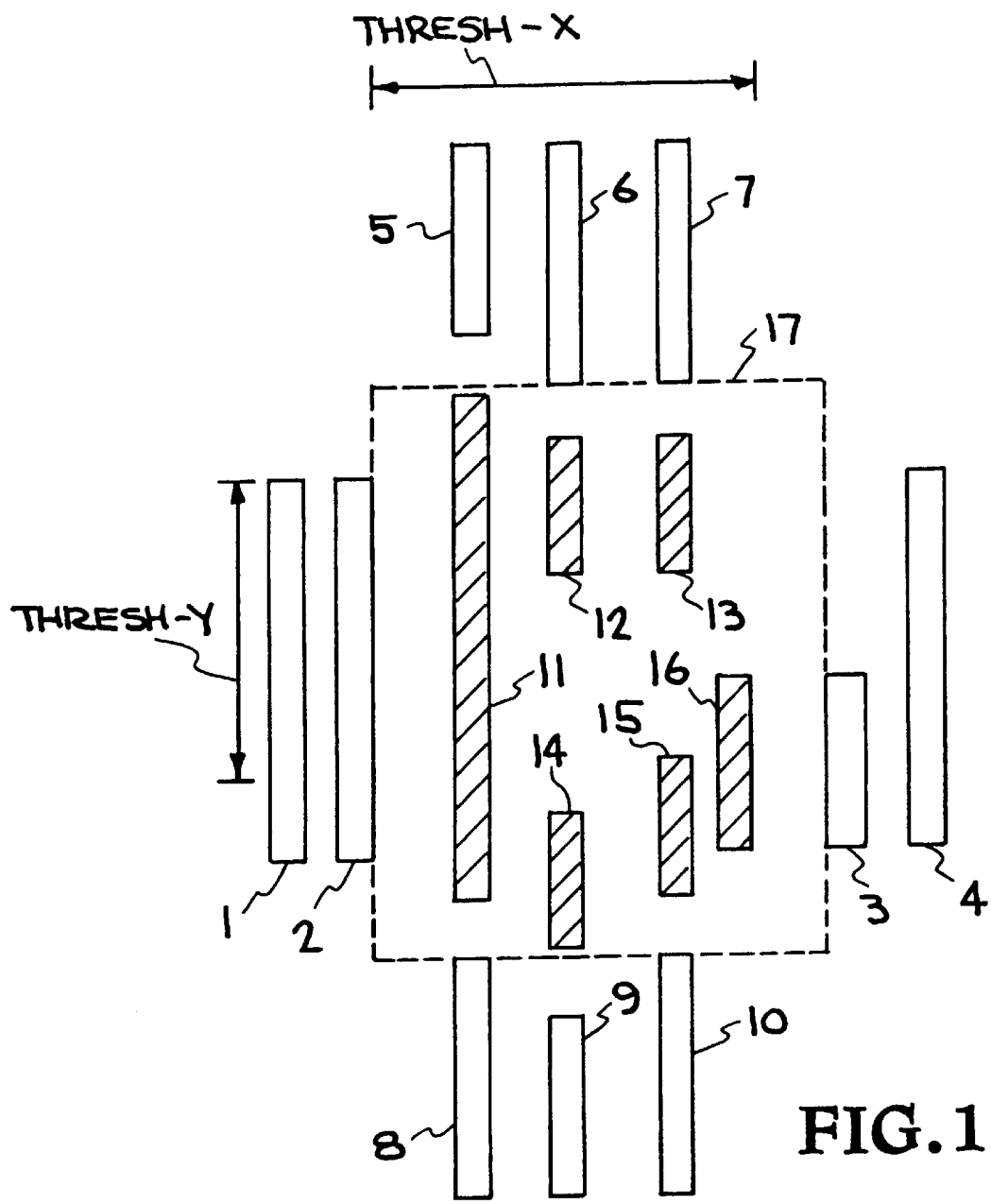
FIG. 1 illustrates dummy lines interposed between working lines to counter lithographic or etching proximity effects.

Referring to FIG. 1, the distance between working line 2 and working line 3 in the horizontal direction exceeds the threshold distance thresh -x, or the distance between working lines 5–7 and lines 8–10 in the vertical direction exceeds the threshold distance thresh -y. Therefore, dummy lines 11–16 are printed in the area defined by the dashed box 17 to ensure uniform printing of all working lines.

These dummy lines may be left floating, i.e., not connected to the working lines in the circuit to avoid possible shorting or, if desired, the dummy lines may merely comprise unused portions of the total pattern of lines, but not electrically isolated (floating) from the remainder of the wiring harness. The size of dummy lines 11–16 typically remains constant. Hence, a larger defined area between working lines requires the insertion of more dummy lines.

Figure 6:
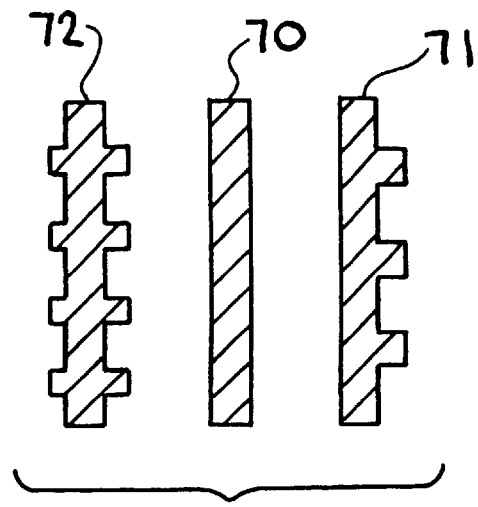
FIG. 6 illustrates two forms of dummy lines.

To facilitate easy identification, the dummy lines may be formed differently than working lines. FIG. 6 shows two possible methods. In FIG. 6, working line 70 is bounded by two dummy lines 71 and 72. Dummy line 71 is typically used for countering lithographic effects while line 72 is generally implemented to solve undercutting problems. Solving for lithographic effects involve very small tolerances in distances, therefore having one smooth side in line 71 is important to solving this problem. Although dummy lines may have many forms, forming the dummy lines into a closed loop may produce an undesirable antenna effect.

Interactive feedback which measures the amount of photoresist on the metal layer significantly reduces the problem of undercutting while etching. Photoresist comprises, among other ingredients, a light-sensitive, i.e., energy-sensitive, polymer. A polymer is a heavy molecule containing carbon, hydrogen, and oxygen formed into a particular repetitive pattern. When multiple lines are etched adjacent one another, i.e., within the threshold distance mentioned previously, the process provides carbon molecules from the polymer which form a coating on the sidewall to prevent undercutting. Hence, the etching will be substantially anisotropic.

However, when the line to be etched is not adjacent to another line, less carbon is available to form the necessary coating. Therefore, the etch becomes ragged, i.e., more isotropic, which may result in circuit breakdown due to undercutting.

In accordance with one aspect of the present invention and current processing techniques, at least approximately 17 percent of the chip must be covered with photoresist in order to provide sufficient amounts of carbon to form the coating which subsequently insures an anisotropic etch. Note the amount of resist is, in effect, the amount of metallization on the chip. If the amount of photoresist (or metallization) is at 17 percent, then placement of dummy lines is unnecessary regardless of less populated areas. Therefore, the determination of photoresist coverage precedes the printing of dummy lines.

To solve the electromigration problem, the current each line will carry is determined from the electrical design before processing. In accordance with the present invention, line width will vary depending upon the kind of duty cycle and current density that will be on each line. In one embodiment, lines carrying larger currents would be widened to greater than $2\mu$ while lines carrying less current could be narrower. A second or complimentary method could be to route a parallel line(s) for high current paths, reducing the current density carried by any one metal line.

Figure 2:
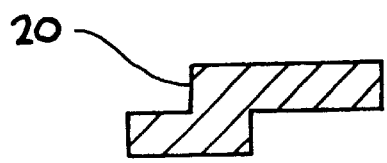
FIG. 2 shows one example of a stress relief point on a metal line.

Because stress due to layering is a function of the amount of metal and the ability of a harder material, i.e., a dielectric, to exert a force over that metal, the user enhances the probability of electrical disconnection by running a very long line along the chip. In accordance with the present invention, a metal line is provided with stress relief points. In one embodiment, the stress relief point is a 90-degree jog on line 20 as seen in FIG. 2. A 90-degree jog is used because it is easy to digitize. A 45 or 60-degree angle, although also solving the layering stress problem would require a smaller resolution and therefore take longer to digitize the output. Stress relief may also be accomplished by vertically jogging from one metal layer to another through a via.

In one embodiment, the above-mentioned considerations are implemented in a router system using a computer programmed with the software found in Appendix A of parent U.S. patent application Ser. No. 07/732,843 (now U.S. Pat. No. 5,379,233), the disclosure of which has already been incorporated by reference. Definitions of options (and default values) used in the software program, and in various portions of the Specification hereinafter, are set forth below in Table I. In this table, the term "OB" stands for obscured options and the term "#" stands for number of microns multiple 1000 if not specified. For example, if #=20000=>200µ.

TABLE I

| Options | Definition |
| --- | --- |
| -<none> | calculate metal utilization and give suggestions for whether lonely lines exist. |
| -help | list available options |
| -insert_wire | inserting wires, none for suggestions |
| -loop | loop until reach required metal utilization |
| -fm_only | process first metal only |
| -sm_only | process second metal only |
| -tm_only | process third metal only |
| -lower_percent | lowest required metal utilization, OB (default 17%) |
| -upper_percent | metal utilization to be added to, OB (default 20%) |
| -thresh_x # | threshold for lonely wire in X direction (default: 100µ),OB |
| -thresh_y # | threshold for lonely wire in Y direction (default: 100µ),OB |
| -mesh_x # | distance between mesh in X direction (default: wire width of protecting wires), OB |
| -mesh_y # | distance between mesh in Y direction (default: wire width of protecting wires), OB |
| -bloat 1_x # | min distance between wire and protecting wires in X direction (default: 15µ), OB |
| -bloat 1_y # | min distance between wire and protecting wires in Y direction (default: 15µ), OB |
| -bloat 2_x # | width for protecting wires in X direction (default: 75µ), OB |
| -bloat 2_y # | width for protecting wires in Y direction (default: 75µ), OB |
| -area_xa # | Outline for checking area, OB |
| -area_ya # | Outline for checking area, OB |
| -area_xb # | Outline for checking area, OB |
| -area_yb # | Outline for checking area (default: center region), OB |
| -wire_type | type for protecting wire, 1 for 1G wire, 2 for 2G wire (default: 2), OB |
| -filled | make filled protections, OB |
| -line | make protections in straight lines, OB |
| -allow_redundancy | allow redundant protections, OB |
| -debug | add more debug information to standard output, OB |

Figure 3:
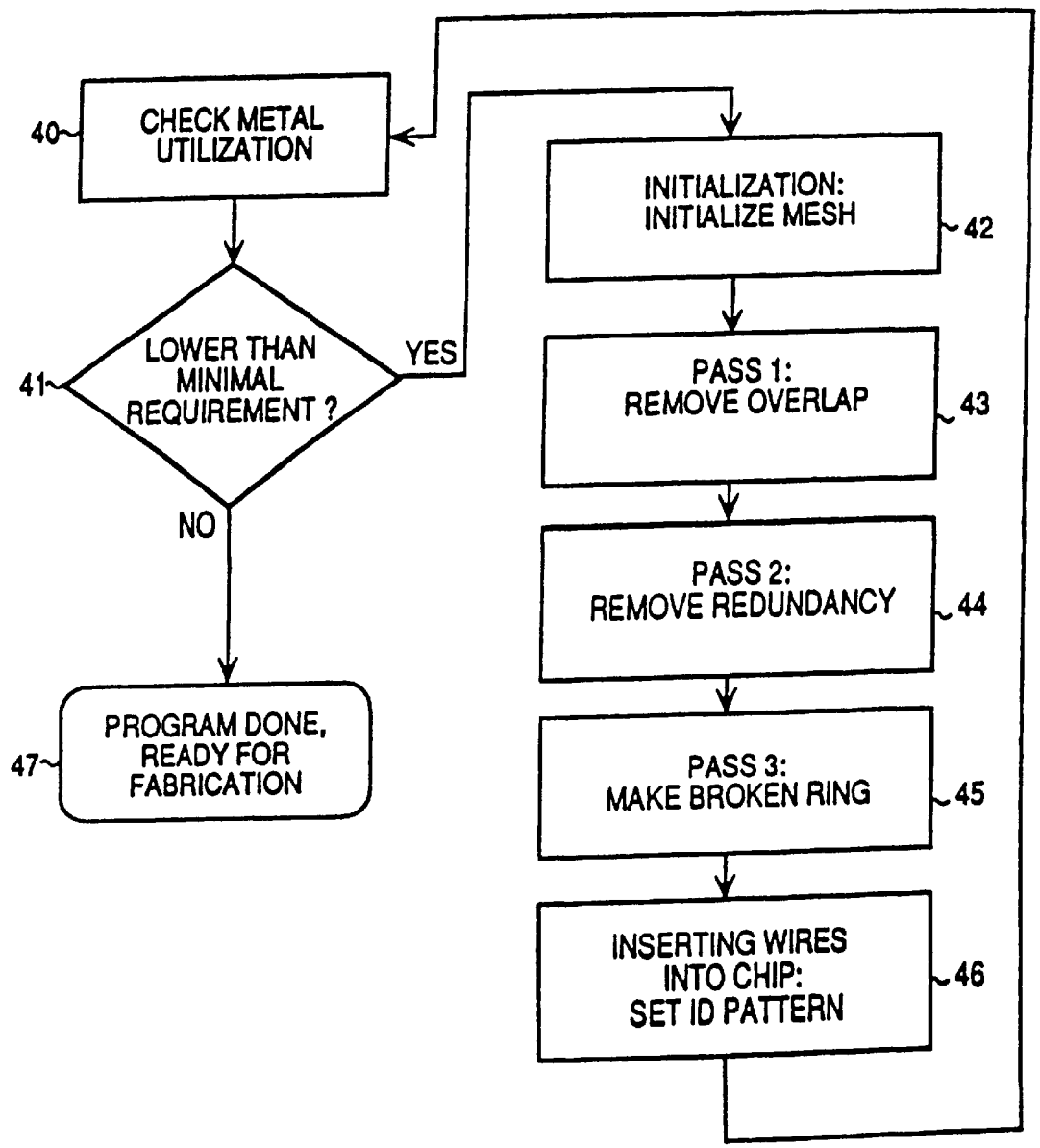
FIG. 3 illustrates a flow chart of the computerized process steps to be performed in accordance with the present invention to determine placement of dummy lines and ensure availability of carbon molecules for anisotropic etching.

FIG. 3 illustrates a flow chart of the process steps performed by the computer to determine placement of dummy lines and to ensure availability of carbon molecules for anisotropic etching. To achieve the goal of having a predetermined amount of photoresist on wafer during etching, it may be necessary to traverse the flow chart loop several times. In the first pass through the loop, the metal utilization being analyzed is based on the metallization used in implementing the electrical circuit. As will be explained more fully below, the metallization area being measured in the first step of subsequent passes includes dummy lines added during the preceding pass(es).

In step 40, the computer determines the metal utilization on the chip. The metal utilization is functionally equivalent to the area of photoresist on the surface of the chip. After this determination is made, the computer proceeds to step 41.

Step 41 questions whether the metal utilization is lower than the minimal requirement. In one embodiment of the present invention, the software specifies this minimal requirement as being at least approximately 17 percent of the surface area of the chip.

Figure 4:
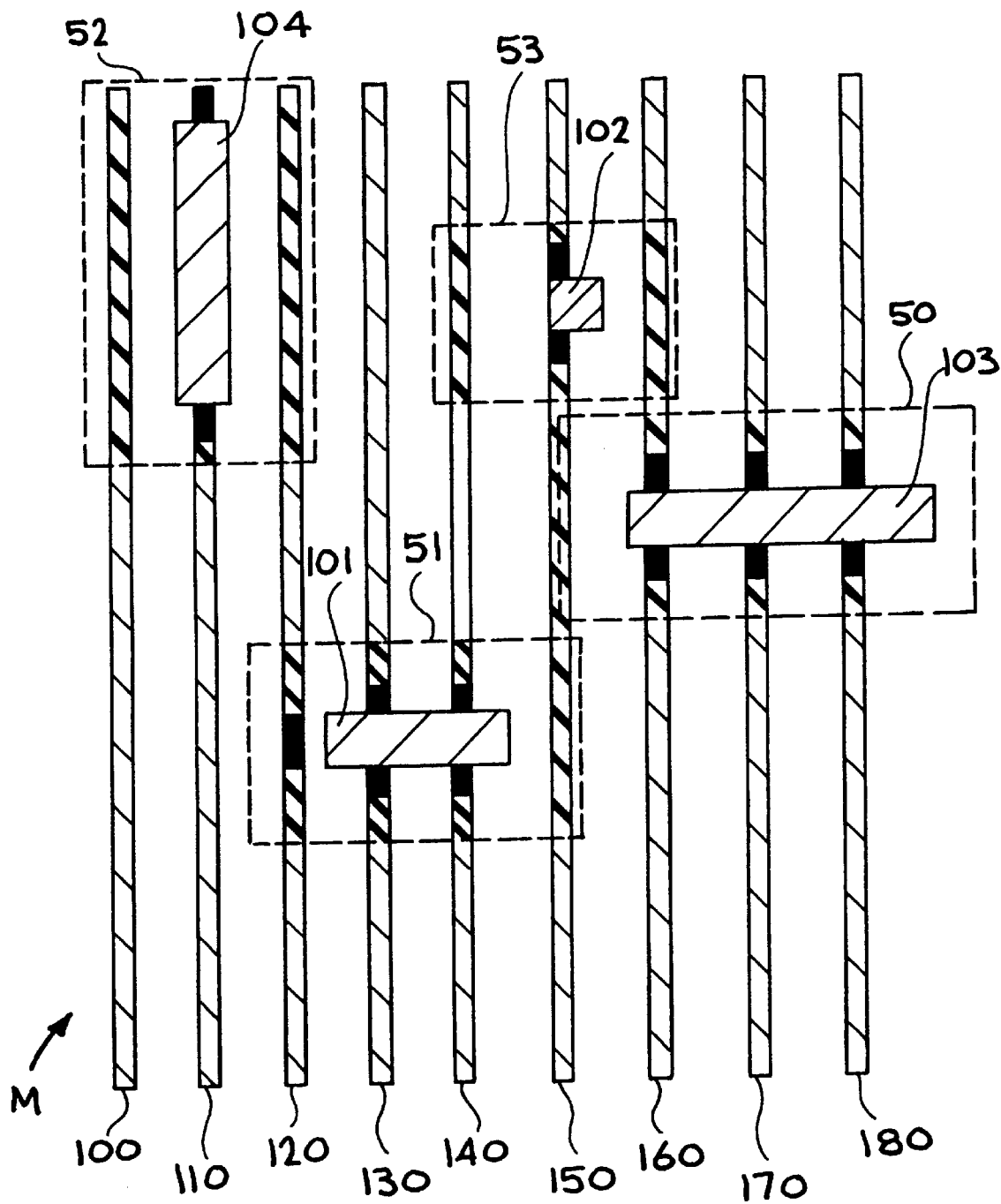
FIG. 4 shows one example of placement of dummy lines after partial removal of a local line mesh.

If the metal utilization is lower than the minimal requirement, the computer proceeds to step 42 which is initializing the mesh. In step 42, initialization includes creating a mesh of dummy lines, also called local wires, in a particular pattern. Referring to FIG. 4, the mesh M in this embodiment is comprised of local wires 100–180, which run parallel to each other. Typically, although not shown in this embodiment, the local wires are positioned in the predominant direction of the working lines, also called physical wires, used for the layer of metallization being examined. Mesh M is superimposed over the already laid out physical wires which are identified in FIG. 4 by reference characters 101, 102, 103, and 104. In one embodiment, local wires 100–180 have a width of approximately 8µ with a distance between adjacent edges of the local wires being approximately 8–9µ. As will be appreciated from FIG. 4, that drawing, as well as other drawings are not necessarily to scale.

In pass 1 which is found in step 43, all overlap between the physical wires and the local wires is removed. This ensures that no shorting will occur between the local wires and physical wires. At this time, the distance between a local wire and physical wire is made to be at least 37 "bloat 1", i.e., a minimum distance between the physical wire and local wire. In one embodiment, "bloat 1" is approximately 15µ. For example, as illustrated in dashed line block 50, the blackened portions at local lines 160–180 will be eliminated from the mesh. Furthermore, local wire segments are removed if their length becomes less than the predetermined threshold distance which in one embodiment is 100µ.

Figure 5:
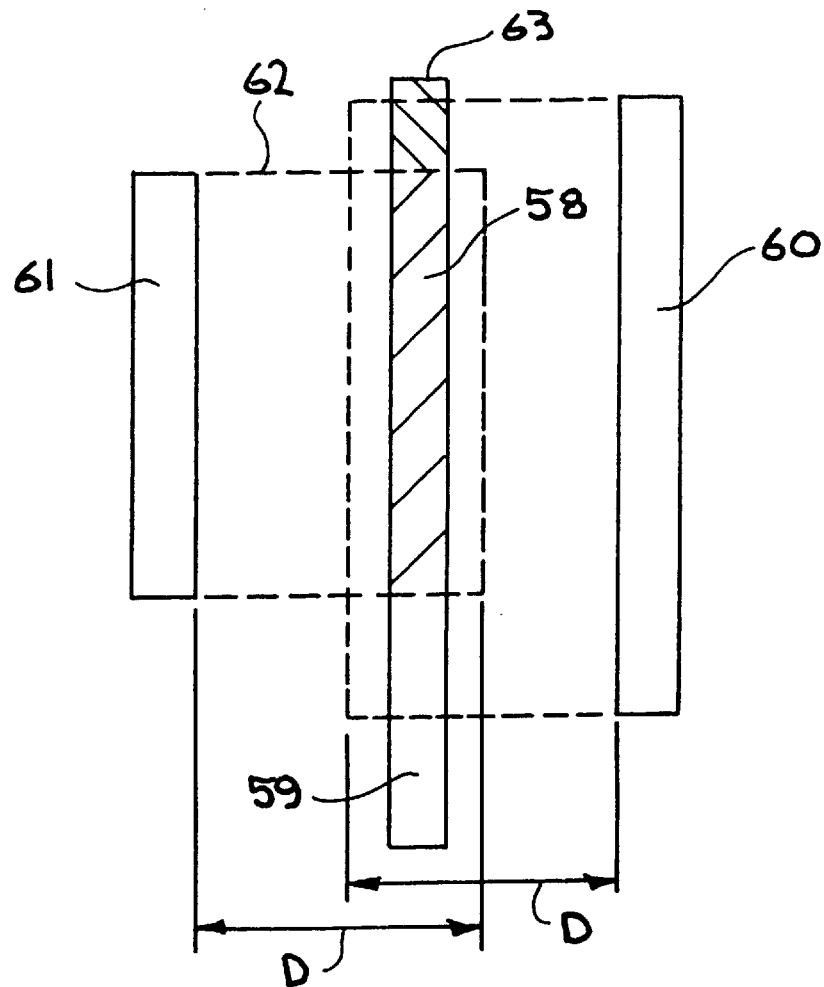
FIG. 5 shows the method of removing redundant local lines performed in pass 2 of the computer program.

During pass 2 found in step 44, local wires are removed if they are found to be "redundant". Removing redundancy is accomplished as follows: local wires are marked from left and right of physical wires if their distance is less a predetermined distance D. Distance D is generally defined as the threshold distance minus ("bloat 1", the minimum distance between the physical and local wire, plus the width of the local wire.) Distance D is roughly slightly larger than the threshold distance divided by two. For example, if a segment 58 of local wire 59, as shown in FIG. 5, is marked from both the left and the right of physical wires 60 and 61 by a distance D, respectively, then segment 58 of local wire 59 is removed. Once again, if the remaining local wire segment is less than the threshold value, it is also removed. As illustrated in FIG. 5, portion 63 which extends above dashed line 62 is less than the threshold value, and will be removed.

During pass 3 found in step 45, portions of local lines inside a predetermined periphery of the physical wires are marked and will be maintained, while portions not marked will be removed. For example, as seen in FIG. 4, dummy lines, or portions thereof, outside a predetermined periphery (indicated by dashed line boxes 50–53) of each physical line (100–103) are removed to minimize the amount of dummy line metallization added to the chip. If the boundary contacts a local line, as box 50 does with line 150, the local line is not removed. Thus, the cross-hatched portions of the mesh of dummy lines 10–18 are removed. The dummy lines to remain are indicated by the double-thick hatching.

During the final step 46, all remaining portions of local lines are generated in a distinguishable pattern to facilitate identification of these local line portions. After step 46 is completed, the computer returns to the initial step 40 for determining metal utilization which is now the sum of the physical wires and remaining portions of the local lines. If the metal utilization is found to still be lower than the minimal requirement, then the computer repeats steps 42–46 until the metal utilization is not lower than the minimal requirement. Before repeating steps 42–46 on the second traverse through these steps, the local line portions which were created during the first traverse of steps 42–46 are treated as physical wires and the creation of the mesh for the second traverse is conducted in the same manner as previously done. Local lines created in the second and any subsequent loops are similarly treated. When this requirement is met, the computer ends the program at step 47, and the resulting layout is then ready for fabrication.

The preceding description is meant to be illustrative only and not limiting. The above describes the metal etch undercutting problem. For lithographic, electromigration, and layering stress problems, the methods would be similar but not identical.

b. Use of Dummy Lines to Balance Loading During Chemical/Mechanical Polishing

Chemical/Mechanical Polishing (CMP) has become a valuable tool in the planarization of integrated circuit structures to thereby provide the required flat surface needed for further lithography to be accurately carried out. For example, while dry etching can be used to planarize structures where a planarizing material (e.g., photoresist) has an etch rate approximating that of the material to be planarized (e.g., silicon oxide), CMP techniques can be used, and are sometimes preferred, where materials are present which do not respond to dry etching at the same rate.

However, when the materials to be planarized do not respond at the same rate to CMP processing and the ratio of such materials differs from one area to another across the surface to be planarized, the region of highest density of the material removable at a higher rate will polish faster, resulting in a dished out portion rather than the desired planar surface, and conversely, the region where such material removable at a higher rate is not present, or present in a lower density, will polish at a lower rate, results in high spots in the surface. This can occur, for example, where electrically conductive lines, formed from materials such as metals, e.g., aluminum, gold, tungsten, titanium, titanium/tungsten alloys, etc., or other electrically conductive materials, e.g., a doped semiconductor such as doped polysilicon, are separated by an insulation material such as silicon oxide (which does not respond as fast to CMP procedures) located between the lines, and the lines are not uniformly spaced apart, i.e., do not have a uniform density across the integrated circuit structure. A similar effect can occur with respect to vias and/or contact openings formed in an oxide layer and then filled with electrically conductive materials prior to a planarization step using a CMP process.

Figure 7A:
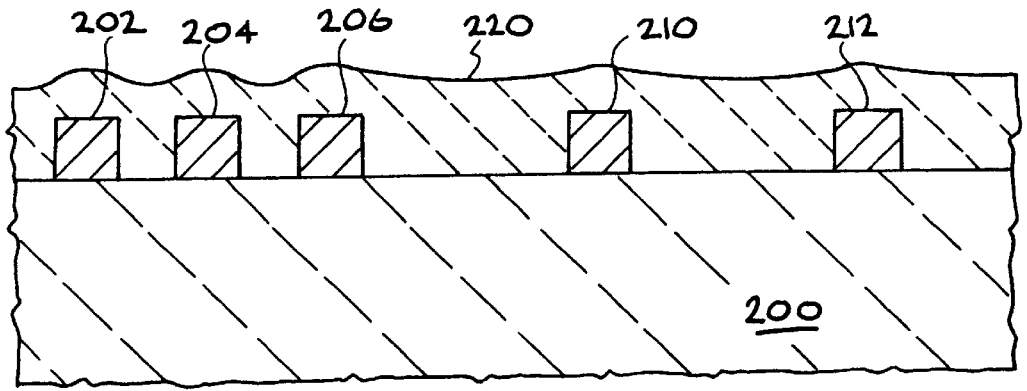
FIG. 7A is a fragmentary vertical cross-sectional view of an integrated circuit structure showing closely spaced apart (high density) lines as well as lonely lines with a layer of oxide formed over the lines, as in the prior art, prior to a planarization process step.
Figure 7B:
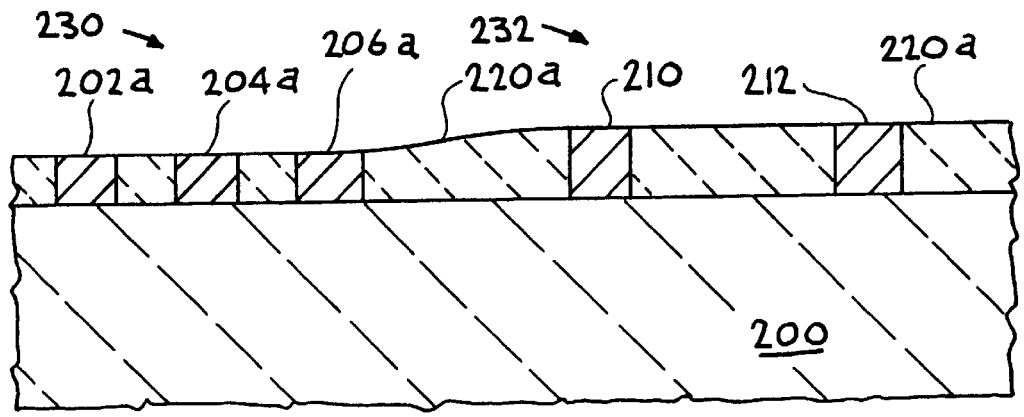
FIG. 7B is a fragmentary vertical cross-sectional view of the integrated circuit structure of FIG. 7A after planarization by chemical/mechanical polishing in accordance with the prior art, showing the area containing closely spaced lines polished to a lower level than the area containing lonely lines.

For example, referring to prior art FIGS. 7A and 7B, when tungsten lines 202, 204, 206, 210, and 212 are formed over an integrated circuit structure 200, and then a silicon oxide layer 220 is formed over and in between lines 202, 204, 206, 210, and 212, as shown in FIG. 7A, the structure will not respond uniformly to a CMP procedure because the tungsten is more easily polished than the silicon oxide. Therefore, in the region where tungsten lines 202, 204, and 206 are shown as closely spaced together, there is less silicon oxide surface in between the lines to be polished and the polishing proceeds at a faster rate, while the region where tungsten lines 210 and 212 are widely spaced apart comprises a larger area of silicon oxide exposed to the CMP procedure and the overall structure polishes at a lower rate. The result, as shown in FIG. 7B, is a low region, indicated by arrow 230, where remaining portions 202*a*, 204*a*, and 206*a* of original tungsten lines 202, 204, and 206 in between remaining silicon oxide layer 220*a* are closely spaced, while a high region, indicated by arrow 232, designates a region where tungsten lines 210 and 212 are more widely spaced apart, i.e., there is more silicon oxide surface to be polished.

Figure 8:
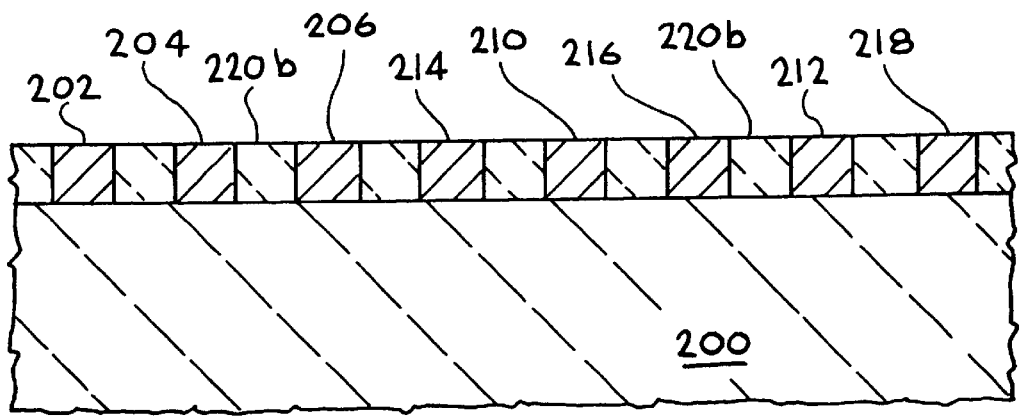
FIG. 8 is a fragmentary vertical cross-sectional view of an integrated circuit structure showing dummy lines added in the vicinity of the lonely lines in accordance with the invention to provide an more uniform planarization by chemical/mechanical polishing.

In accordance with this aspect of the invention, as shown in FIG. 8, to provide a more uniform loading of the structure for CMP processing, dummy lines 214, 216, and 218, preferably formed of the same material as lines 210 and 212, are formed adjacent lines 210 and 212, resulting in a more even density of lines in between remaining silicon oxide layer 220*b*, which in turn, means that the CMP planarization process proceeds at a more uniform rate across the entire region, resulting in the desired planarized surface. It should be noted that such additional lines 214, 216, and 218, while referred to herein as "dummy lines", need not be electrically floating with respect to the remainder of the wiring harness comprising the patterned layer of electrically conductive material. That is, the additional dummy lines may be electrically connected to the remainder of the wiring harness. In some instances, however, it may be preferable that such additional dummy lines not be connected to the remainder of the wiring harness to avoid possible shorting.

The determination of where to place such dummy lines for purposes of balancing the loading during CMP procedures can be made empirically, e.g., by inspecting the structure for low spots after CMP planarization, or by using methods such as described above for balancing the loading during patterning of the electrically conductive layer of material to form the wiring harness.

c. Use of Dummy Vias (or Contact Openings) to Balance Loading of Vias (or Contact Openings) During Etching of Same Similar problems to those experienced during the forming of lines (e.g., a wiring harness) by etching during the patterning of an electrically conductive layers, as discussed above, may also be encountered during the etching of one or more insulation layers, e.g., such as the etching of a silicon oxide or silicon nitride insulation layer, to form contact openings through the insulation layer or layers to underlying active or passive devices in the underlying semiconductor wafer, or similar etching through an intermediate insulation layer to form a via between two layers of electrically conductive materials, such as between two patterned metal layers.

That is, vias or contact openings may be located on an insulation layer or layers where a low density of contact openings or vias results in an oversized contact opening or via being formed, due to the lack of a depletion of etchant which is normally experienced in areas of high density contact openings or vias. Since such a problem is common to both the etching of a first insulation layer or layers to form a contact opening to the underlying semiconductor substrate and to the etching of subsequent insulation layers to form vias between layers of electrically conductive materials, the term "vias" will hereinafter be used to refer to both vias and contact openings in an insulation layer, and such vias subject to such over etching due to low density spacing will be referred to hereinafter as "lonely vias".

Such a "lonely via" may be defined as a via having a diameter which exceeds the average diameter of the vias in the same insulation layer by an amount in excess of about 10%. For example, if the average diameter of the vias on the insulation layer is about 0.5 micrometers ($\mu$m) or microns, a lonely via may be defined as a via whose diameter exceeds this average diameter by at least 0.05 $\mu$m. Since, for example, the tolerance permitted in 0.5 $\mu$m technology is ±0.07 $\mu$m, any via already having an oversize dimension of 0.05 $\mu$m due to such over etching because of a lack of etchant depletion would be more likely to end up being formed out of specification due to the additive effects of other patterning tolerances such as photolithographic inaccuracies.

Therefore, it is important to identify such "lonely vias" in a design and, in accordance with the invention, to provide dummy vias adjacent such lonely vias so that the etchant depletion becomes more homogeneous across the insulation layer as the openings or vias are etched through the insulation layer.

It should be noted that the location of such dummy vias, with respect to the substrate or other layers underlying the insulation layer is not important, since such dummy vias, after filling of same with electrically conductive materials (while similarly filling the active vias) will normally not be connected electrically to any part of the overlying wiring harness (patterned layer of electrically conductive materials formed over the insulation layer). However, should a problem arise in keeping the filled dummy via electrically isolated from the overlying wiring harness, this can be easily remedied by locating the dummy via over an insulation region beneath the insulation layer, e.g., form the dummy via or vias in portions of the insulation layer which overly field oxide regions of the substrate.

The need for such dummy vias and their subsequent placement on the integrated circuit structure may be determined empirically by, for example, examination and measurement, either visually or by some other means, of the diameter of a via suspected of being a "lonely via" by its location on the insulation layer, using, for example, a grid superimposed over the surface of the structure, as will be discussed below. Identification of lonely vias and the corresponding placement of dummy vias to compensate for the lonely vias may also be carried out using a modification of the computer controlled routing system previously disclosed and discussed in parent U.S. patent application Ser. Nos. 08/362,839 and 07/732,843.

Figure 12:
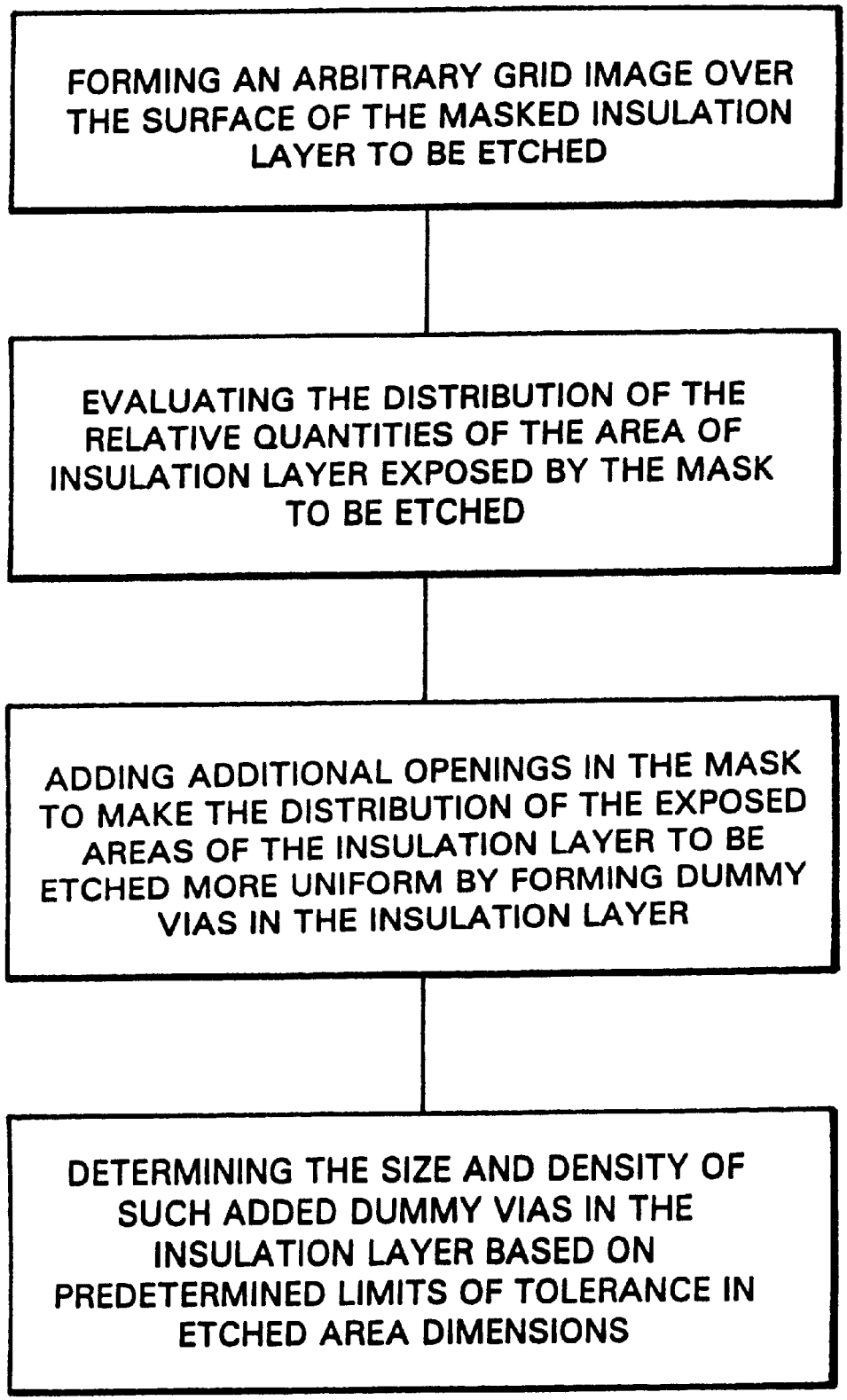
FIG. 12 is a flowsheet illustrating the process of adjusting the distribution of contact openings and/or vias in an integrated circuit structure for balancing of etch loading.

As shown in the flowsheet of FIG. 12, the placement of dummy vias where needed on an integrated circuit structure may be carried out according to the following steps: 1) an arbitrary grid may be formed over the surface of the masked insulation layer to be etched; 2) the distribution of the relative quantities of area of the insulation layer exposed by the mask to be etched may then be evaluated using the grid; 3) additional openings may then be added in the mask to make the distribution of the exposed areas of the insulation layer to be etched more uniform by forming dummy vias in the insulation layer; and 4) the size and density of such added dummy vias in the insulation layer may be determined based on predetermined limits of tolerance in etched area dimensions.

Figure 10:
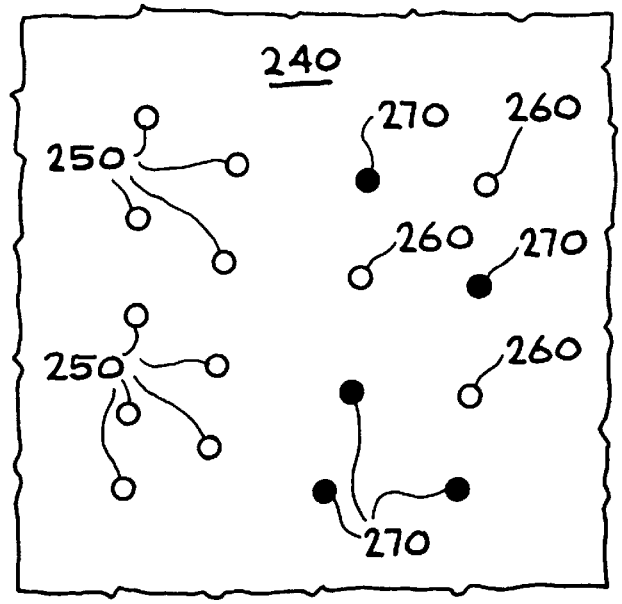
FIG. 10 is a fragmentary top view of an integrated circuit structure showing the placement of dummy vias or contact openings in an insulation layer to enhance the homogeneous etch loading of the structure during formation of the vias and/or contact openings.

Thus, as shown in FIG. 10, when closely spaced apart vias 250 are formed in one area of an insulation layer 240, while lonely vias 260 are formed in another region, the lack of depletion of the etchant in the area around vias 260 could result in the formation of vias 260 of larger diameter. However, by the provision of dummy vias 270 (shown in black in FIG. 10), the loading effect is evened out and the amount of depletion of etchant is more even, resulting in a more uniform diameter of all of the vias.

It should be noted that while the control of the uniformity of etching of one or more insulation layers to form vias or contact openings has been described, to provide a more uniform diameter of working vias, regardless of their density, the same techniques can be used to improve the uniformity of other structures formed by the etching of the one or more insulation layers, such as, for example, the formation of oxide spacers on the sidewalls of gate electrodes or the like, e.g., by the placement and formation of dummy spacers.

d. Use of Dummy Vias for Stress Relief of Underlying Metal Layer

While the placement of dummy vias in regions where lonely vias exist will provide a load leveling of the etchant depletion, thus resulting in less dimensional variations in via diameter, i.e., resulting in a dimensional variation closer to 1:1 (the theoretical goal), dummy vias, if placed correctly, may fulfill another important role.

In typical multi-level interconnect schemes, layers of insulation (dielectric) and electrically conductive materials are sequentially deposited and patterned. Usually the patterned layer of electrically conductive material, e.g., lines, comprises a main metal portion comprising aluminum or an aluminum alloy such as an Al—Cu alloy or an Al—Cu—Si alloy. Such a main portion is usually sandwiched between a thin lower layer of titanium and thin upper layers of titanium and titanium nitride. These thin layers are relatively hard and are effective in preventing hillocks and other deformations of the aluminum lines during thermal processing.

It has been discovered, however, that the stress which builds up in such aluminum lines can be sufficient to cause the aluminum to flow upwards through vias (representing areas where there is no restraining overlying insulation material such as oxide). This can form volcanos or hillocks, depending upon the extent of the aluminum flow, which, in turn, is dependant upon the amount of stress buildup. The amount of stress buildup is, in turn, related to the density of the vias, since a little expansion into many vias can decrease the stress buildup without, however, unduly affecting the upper surface of the structure. On the contrary, however, in areas where lonely vias are located, the low density of via areas can result in the more disruptive flow of aluminum through such lonely vias to the upper surface of the insulation layer, resulting in the above-described undesirable volcanos or hillocks.

In order to relieve such stress, and to prevent or inhibit the formation of such volcanos or hillocks, in accordance with the invention, dummy vias are strategically placed near lonely vias, i.e., whenever the distance between actual or working vias exceeds a predetermined limit. Such a predetermined limit may be determined empirically by visual inspection of the resulting structure, using microscopy means such as a scanning electron microscope, to note the presence of such undesirable hillocks or volcanos.

The need for such dummy vias and their subsequent placement on the integrated circuit structure may also be determined prospectively by, for example, projecting an outline of the underlying metal layer over the surface of the structure, together with a grid superimposed over the outline of the metal layer, as will be discussed below, and then analyzing the outline of the metal layer and the grid to predict where dummy vias will be needed, i.e., where lonely vias exist and where such hillocks and/or volcanos will, therefore, be likely to occur.

Figure 11:
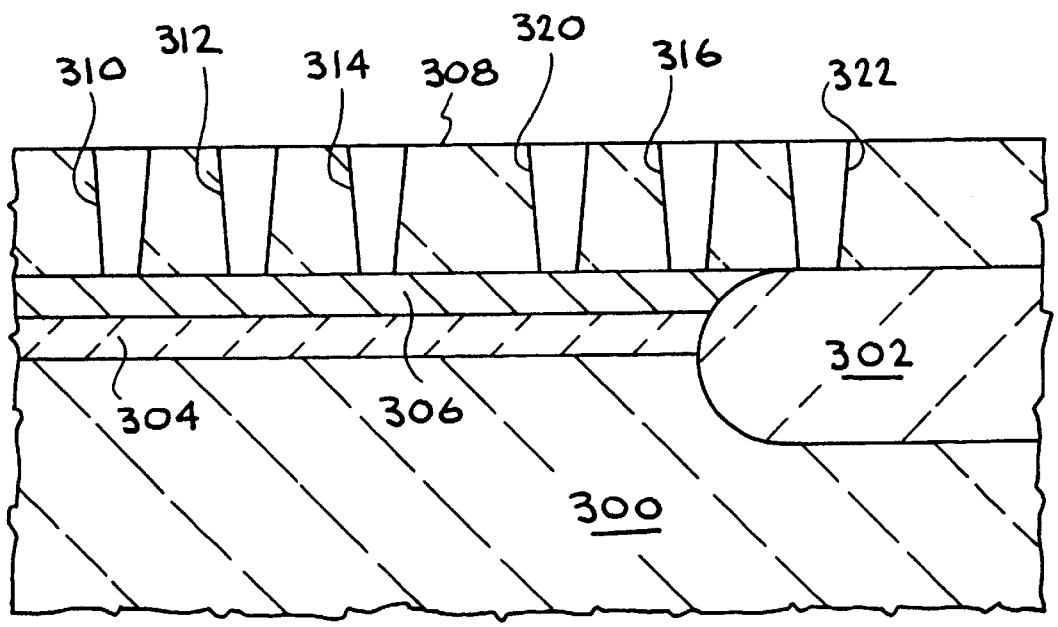
FIG. 11 is a fragmentary vertical side-section view of an integrated circuit structure showing an insulation layer formed over a metal layer, illustrating correct and incorrect placement of dummy vias to relieve stress in the underlying metal layer.

It should be noted, however, that unlike the previous embodiment, the dummy vias, to be effective in relieving stress in the underlying metal layer, must extend through the insulation layer to the metal layer, i.e., the dummy via cannot terminate on an underlying insulation portion, such as a field oxide portion as in the previous embodiment. This is shown in FIG. 11 wherein an integrated circuit structure 300 is shown having a field oxide portion 302 and a first oxide layer 304 formed thereon with a metal layer 306 shown formed over first oxide layer 304. A second oxide layer 308 has been formed over metal layer 306 and field oxide 302. Closely spaced working vias 310, 312, and 314 are shown formed on the left side of the figure, while a lonely via 316 is shown on the right. Stress buildup in underlying metal layer 306 can be distributed between vias 310, 312, and 314, but stresses in metal layer 306 adjacent lonely via 316 can result in pressure relief only through the single via. Placement of dummy via 320 adjacent lonely via 316 can result in stress relief, since dummy via 320, like lonely working via 316, extends down to metal layer 306. However, the placement of dummy via 322 in oxide layer 308 to extend down to field oxide 302, rather than metal layer 306, provides no stress relief. As referred to above, placement of such dummy vias over the metal layer, and not over lower insulation regions, may be determined by projecting onto the structure an outline of the underlying metal layer.

In one aspect of the invention, the occurrence of such undesirable hillocks or volcanos may be inhibited or prevented by placing one or more dummy vias adjacent each working via. The density of the structure may not permit 100% coverage of the working vias with dummy vias, but this will not be a problem because such working vias which cannot be provided with adjacent dummy vias, because of the high density of adjacent working vias, will not be "lonely vias" and will not, therefore, be vias subject to the problems of hillock and volcano formation discussed above.

Figure 13:
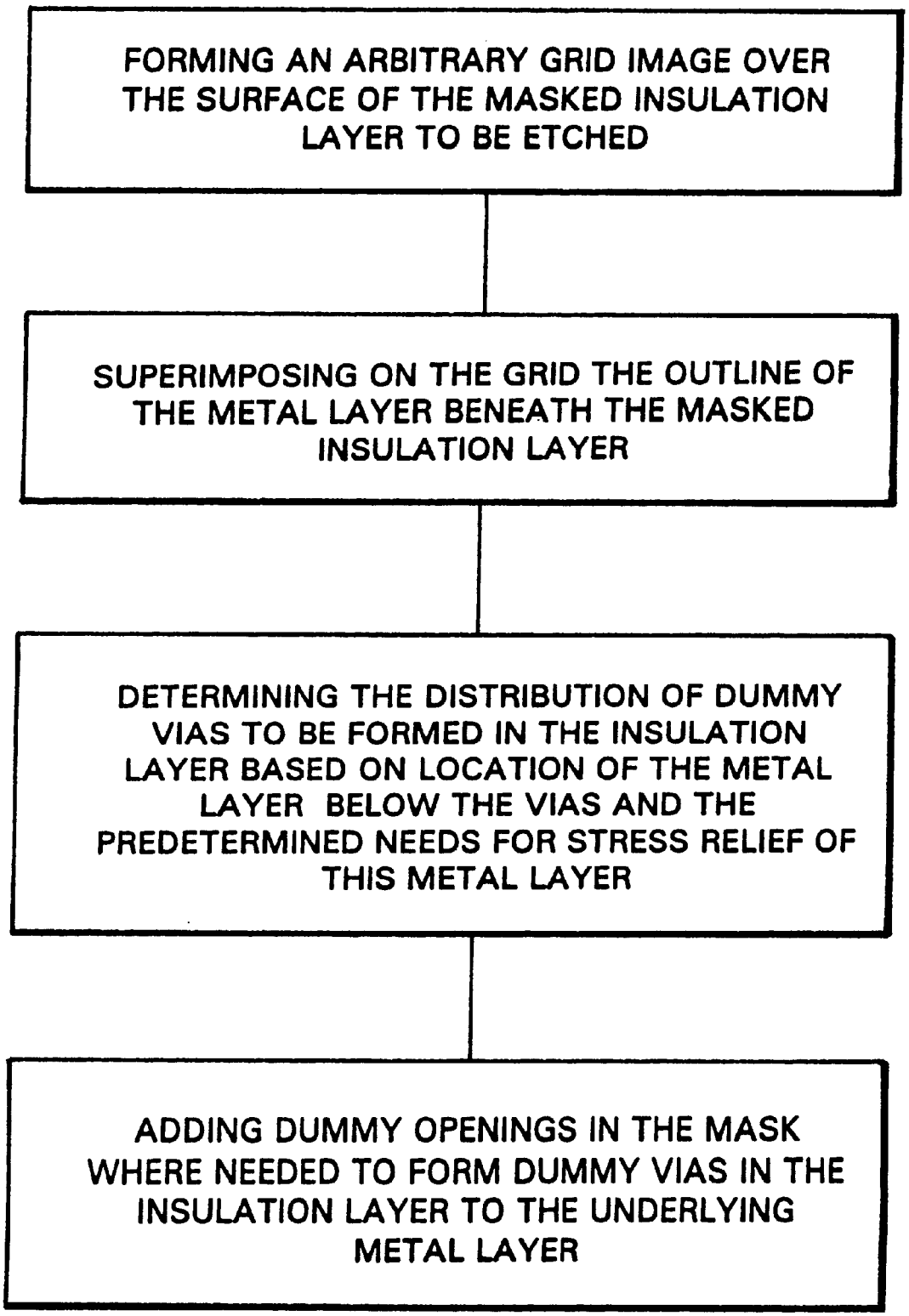
FIG. 13 is a flowsheet illustrating the process of adjusting the distribution of vias in an integrated circuit structure for relief of stress in an underlying metal layer.

As shown in the flowsheet of FIG. 13, the placement of dummy vias where needed on an integrated circuit structure to relieve stress in the underlying metal layer may be carried out according to the following steps: 1) an arbitrary grid may be formed over the surface of the masked insulation layer to be etched; 2) the outline of the underlying metal layer may be superimposed on the grid; 3) the distribution and location of such added dummy vias in the insulation layer may be determined based on location of the metal layer below the vias in the insulation layer, and the predetermined needs for stress relief of this metal layer; and 4) dummy openings may then be added in the mask where needed to form dummy vias in the insulation layer to the underlying metal layer.

e. Use of a Grid Superimposed over the Structure to Identifications of High Density Lines and Vias, and Lonely Lines and Vias, To Determine Placement of Dummy Lines or Vias The placement of dummy lines and contact openings and/or vias for any of the purposes previously described, i.e., to provide for more uniform etching of the lines, contact openings, and/or vias for patterning purposes, for facilitating the planarization of integrated circuit structures by chemical/mechanical polishing, or to provide more uniform stress relief of an underlying stressed metal layer, can be facilitated by the use of a grid which may be superimposed over an image of the integrated circuit structure, e.g., implemented in software and then displayed on a CRT screen with the integrated circuit structure, to assist in both the analysis of the structure and identification of the precise location for the placement of such dummy lines and/or dummy vias. The general procedure used is outlined in the flowsheet of FIG. 9.

The formation of a grid superimposed on the surface of an integrated circuit structure has been used in the past to analyze and correct for optical proximity problems wherein, for example, in the patterning of a photoresist layer over an electrically conductive layer to form two lines, the proximity of the two lines, or the intersection of two lines, tends to enhance the projected images on the photoresist, resulting in either a widening or narrowing of the equivalent metal lines (depending upon whether a positive or negative resist system is being used). The use of a finely spaced grid image enables one to identify the precise location on the integrated circuit structure where such potential problems exist and provide further for precise locating of the compensating means, such as, for example, a wider pattern in a region where the lines are too thin or narrow, of the placement of non-printing lines (known as assist features) adjacent to the normal line on the master mask where the image projected onto the photoresist would result in the formation of a line which is too wide. Other examples of potential problems and their compensating means are lengthening at line ends on the master mask where the image projected onto the photoresist would result in the formation of lines that are too short, addition of serifs to outside corners in regions where the projected images would result in the formation of "rounded off" features, and the subtraction of serifs from inside corners in regions where the projected images would result in the formation of filled in features.

Such a finely spaced grid may be used, in accordance with the invention, to analyze and correct for non-optical proximity problems such as have been discussed above. With respect to load balancing of either working lines or working vias (or contact openings) during the etching of the electrically conductive material (for formation of lines) or the etching of the insulation layer (for the formation of vias or contact openings), the superimposed grid can be of assistance in identifying those regions where problems are likely to occur, and then to assist in identifying the precise location where dummy lines and vias and/or contact openings should be placed to compensate for etchant depletion or high concentration of etchant.

Similarly, the finely spaced grid may be of assistance in analyzing the integrated circuit structure for potential planarizing problems when using CMP procedures by assisting in the identification of high density locations of materials having different polishing rates that adjacent materials, as discussed above, and then assisting in identification of the exact addresses where compensating dummy lines may be placed to allow the polishing process to proceed homogeneously.

Finally, the finely spaced grid may be used in combination with an image of the outline of an underlying metal layer for use in identifying areas of a metal layer beneath an insulation layer where stress buildup is more likely to occur, due to the absence or low density of vias which otherwise would be available to provide stress relief for the underlying metal layer, and then in providing precise addressing of those locations where compensating dummy vias should be placed to extend down through the insulation layer to those areas beneath insulation layer where the metal layer is located.

Thus, the invention provides for the use of dummy lines and contact openings and/or vias to provide compensation for various effects which may affect the quality of the integrated circuit structure, including etchant depletion effects, chemical/mechanical polishing nonplanarizing effects, and stress buildup in metal layers used in the formation of working lines for electrical interconnections of various portions of the integrated circuit structure.

Having thus described the invention what is claimed is:

1. A method of improving a uniformity of the planarization of a polishable material using chemical mechanical polishing, comprising the steps of:

forming a first set of working lines and a polishable material in a first region of a substrate, wherein said first region includes a first density of said first set of working lines, and wherein the chemical mechanical polishing rate for said polishable material in said first region is a function of said first density of said first set of working lines;

forming a second set of working lines and said polishable material in a second region of said substrate, wherein said second region includes a second density of said second set of working lines less than said first density, and wherein the chemical mechanical polishing rate of said polishable material in said second region is a function of said second density of said second set of working lines; and forming at least one dummy line in said second region wherein said second region includes an increased second density of lines comprised of said at least one dummy line and said second set of working lines, in a manner that said first and increased second densities of lines are better matched to better equalize the chemical mechanical rates of said polishing material in respective first and second regions.

2. The method of claim 1, wherein said first set of working lines comprise an electrical conductor and said polishable material is an electrical insulator.

3. The method of claim 2, wherein said first set of working lines consists essentially of the following materials: aluminum, gold, tungsten, titanium, titanium/tungsten alloy, or doped polysilicon.

4. The method of claim 3, wherein said polishable material includes silicon dioxide.

5. The method of claim 1, wherein said dummy line includes an electrical conductor.

6. The method of claim 1, wherein the chemical-mechanical polishing rate of said polishable material in said first region is greater than the chemical-mechanical polishing rate of said polishable material in said second region.

7. The method of claim 1, wherein said at least one dummy line is not electrically connected to said second set of working lines.

8. The method of claim 1, wherein said at least one dummy line is electrically connected to said second set of working lines.

9. A method of improving a uniformity of the planarization of a polishable material using chemical mechanical polishing, comprising the steps of:

forming a first set of working vias through a first insulation layer in a first region of a substrate, wherein said first region includes a first density of working vias, and wherein the chemical mechanical polishing rate of said first insulation layer in said first region is a function of said first density of working vias;

forming a second set of working vias through said first insulation layer in a second region of said substrate, wherein said second region includes a second density of working vias that is less than said first density of working vias in said first region, and wherein the chemical mechanical polishing rate of said first insulation layer in said second region is a function of said second density of working vias; and forming at least one dummy via through said first insulation layer in said second region wherein said second region includes a third density of working and dummy vias that better matches said first density of working vias in said first region to better equalize the chemical mechanical rates of said first insulation layer in respective first and second regions.

10. The method of claim 9, wherein said at least one dummy via includes electrically conducting material therein.

11. The method of claim 10, wherein said electrically conducting material is not electrically connected an overlying wiring harness.

12. The method of claim 9, wherein said at least one dummy via is formed through said first insulation layer that overlies a second insulation layer.

13. The method of claim 12, wherein said second insulation layer is an oxide layer.

14. The method of claim 13, wherein said oxide layer is a field oxide layer.

15. The method of claim 9, further including the following steps:

forming a grid over said first insulation layer;

evaluating the distribution of said working vias with the use of said grid;

forming additional dummy vias through said first insulation layer to provide more uniform distribution of said working and dummy vias in said first and second regions; and determining the size and density of such additional dummy vias based on pre-determined limits of etch tolerances.

16. A method of for relieving stress of a metal layer underlying a plurality of working vias, comprising the steps of:

forming a first set of working vias through an insulation layer in a first region of a substrate, wherein said insulation layer overlies a metallization layer;

forming at least one dummy via through said first insulation layer down to said underlying metallization layer within said first region if the distance between said working vias exceeds a pre-determined level to reduce said distance to better prevent hillocks or volcanoes of said underlying metallization layer through said working vias during chemical mechanical polishing of said insulation layer and;

forming a grid over said insulation layer;

superimposing the outline of said underlying metallization layer on said grid;

determining the distribution and location of said at least one dummy via; and forming additional dummy vias wherein the distance between working and dummy vias does not exceed said pre-determined level.

17. The method of claim 16, further including the step of forming at least one dummy via per and adjacent to each working via in said first region.

18. A method improving a uniformity of the planarization of a polishable material using chemical mechanical polishing, comprising the steps of:

providing a substrate;

forming a first set of working lines and a polishable material in a first region of said substrate, said first region having a first density of said first set of working lines, and wherein the chemical mechanical polishing rate of said polishable material in said first region is a function of said first density of working lines;

forming a second set of working lines and said polishing material in a second region of said substrate, said second region having a second density of said second set of working lines that is less than said first density of said first set of working lines, and wherein the chemical mechanical polishing rate of said polishable material in said second region is a function of said second density of said second set of working lines; and forming at least one dummy line in said second region to increase said second density to better match said first and second densities to better equalize the chemical mechanical rates of said polishing material in respective first and second regions.

* * * * *